United States Patent [19]

Rooney

[11] Patent Number: 5,144,709
[45] Date of Patent: Sep. 8, 1992

[54] FORMATION OF SHAPES IN A METAL WORKPIECE

[75] Inventor: James F. Rooney, Bethany, Conn.

[73] Assignee: Olin Corporation, Cheshire, Conn.

[21] Appl. No.: 695,058

[22] Filed: May 3, 1991

[51] Int. Cl.$^5$ .............. B21D 28/00; B23P 13/04; H01R 43/00; H01L 29/60

[52] U.S. Cl. .............. 7/335; 72/379.2; 29/557; 29/827; 357/70; 437/925

[58] Field of Search .............. 72/335, 379.2, 404, 72/405, 421, 332, 341, 374, 376, 377; 29/414, 417, 432.2, 515, 557, 558, 827, 830, 835, 852, 853, 882; 357/70; 437/207, 211, 217, 925, 927

[56] References Cited

U.S. PATENT DOCUMENTS

| | | | |
|---|---|---|---|
| 2,646,613 | 7/1953 | Enzler | 29/882 |
| 3,368,383 | 2/1968 | Marszal | 72/421 |
| 3,391,456 | 7/1968 | Gannoe | 29/827 |
| 3,434,327 | 3/1969 | Speakman | 72/335 |
| 4,047,417 | 9/1977 | Oser et al. | 72/185 |
| 4,245,491 | 1/1981 | Kondo et al. | 72/254 |
| 4,509,355 | 4/1985 | Oishi | 72/325 |
| 4,509,365 | 4/1985 | Budrean et al. | 72/349 |
| 4,553,418 | 11/1985 | Stoehr | 72/132 |
| 4,587,827 | 5/1986 | Wessels | 72/349 |
| 4,803,880 | 2/1989 | Hopkins et al. | 72/354 |
| 4,854,024 | 8/1989 | Grieb et al. | 29/558 |
| 4,897,508 | 1/1990 | Mahulikar et al. | 174/52.4 |
| 4,928,512 | 5/1990 | Rooney et al. | 72/404 |
| 4,939,316 | 7/1990 | Mahulikar et al. | 174/52.4 |

*Primary Examiner*—Lowell A. Larson
*Assistant Examiner*—Thomas C. Schoeffler
*Attorney, Agent, or Firm*—Bruce E. Burdick; H. Samuel Kieser

[57] ABSTRACT

A method and apparatus for forming a shape such as a cavity in a workpiece. An aperture is provided in the area in which the cavity is to be formed. Thereafter, the cavity is depressed into the metal causing the metal to flow into the area from which metal was removed by the aperture formation. If desired, after formation of the original aperture, the cavity may be partially depressed, and the aperture requalified to a circular shape. Thereafter, the cavity may be depressed into the workpiece to its final depth.

18 Claims, 5 Drawing Sheets

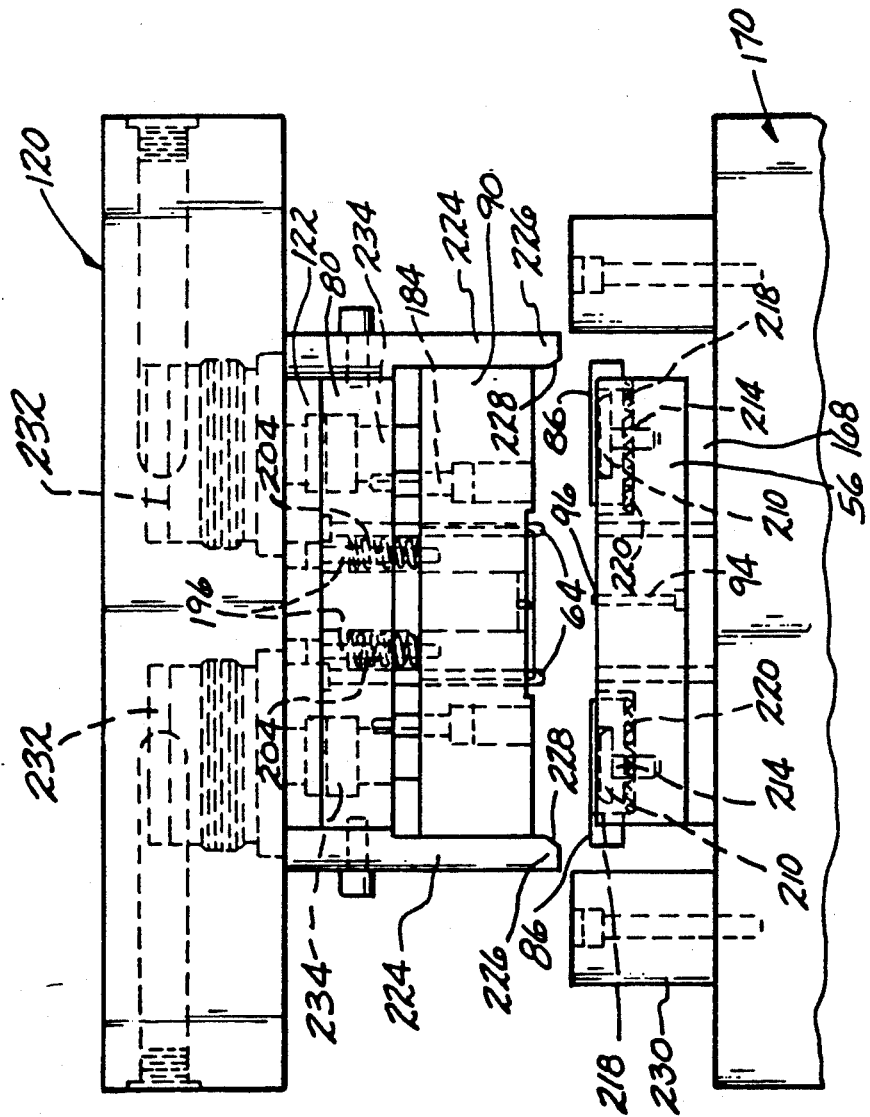

FORMATION OF SHAPES IN A METAL WORKPIECE

BACKGROUND OF THE INVENTION

1. Field of the Invention

This invention relates generally to the formation of a shape in a metal workpiece. More particularly, this invention relates to the formation of a shape such as a cavity in a metal workpiece. The cavity may be defined by a base surface which is generally parallel to the base of the workpiece and which may have a bore and/or counterbore extending into the base which is of a predetermined configuration.

1. BACKGROUND INFORMATION

The present invention has particular utility in forming a metal workpiece which may be used as a component for metal electronic packages. Such packages are shown and disclosed in U.S. Pat. No. 4,897,508. However, it is to be understand that the present invention has broader application and may be used for forming other types of workpiece by the displacement of metal to form a shape therein.

In one form of a metal electronic package, the package comprises two parts, a base component and a cover or lid component. The base component is generally flat without sidewalls and a leadframe is spaced from the base member by a sealant such as an epoxy so it is in a plane which in alignment with the upper surface or bonding face of the electronic device which is attached to the base member. The wire bonds connecting the bonding face of the metal package and the lead frame may flex upwardly so the upper component or lid of the package includes a cavity in its interior surface to provide the space for the flexing while minimizing overall thickness of the package.

One method of obtaining a cavity in a metal workpiece is by stamping. However, when there is a requirement that the impression exceed 15 to 20 percent of the metal thickness, the metal may exceed the shear limit and tend to crack or fracture at the inner edges of the cavity. Additionally, forming the cavity by metal deformation as by stamping requires a large volume of metal to be displaced with the resulting difficulty of achieving the required degree of parallelism.

Other methods of forming cavities in metal include such processes as milling or chemical etching. The disadvantages with metal removal processes of this type are the time required to form each cavity and the metal scrap and waste products. The metal removed rapidly becomes a problem due to the cost and difficulty of disposing the small metallic chips formed as a by-product of the milling operation. In chemical etching, the storing and disposal of the chemicals and waste products produced presents problems.

Still another method of forming a cavity in metal is by imprint rolling. However, this type of process does not provide proper containment of metal flow.

U.S. Pat. No. 4,928,512 discloses another method of forming cavities in a metal workpiece in which a series of punches are used to form a cavity in the workpiece. The series of punches are made up of alternating piercing punches and flat impact punches.

SUMMARY OF THE INVENTION

In accordance with the present invention, it is an object to provide an improved process for forming shapes in a metal workpiece, particularly cavities which have a depth exceeding the sheer limit. The sheer limit is the depth of penetration beyond which the metal cracks. For ductile metals and alloys, this sheer limit may be typically about 33 percent of the overall thickness of the workpiece.

A further object of the present invention is the provision of an improved process for forming shapes in a metal workpiece which lends itself to a continuous, automated process wherein the workpieces may be produced from a continuous strip of metal.

A more specific object of the present invention is the provision of a method for forming a cavity in a workpiece which may also include the formation of a bore in the base of the workpiece having a predetermined configuration.

These and other objects and advantages of the present invention may be achieved by a process and apparatus which includes removing a portion of the metal in the area of the workpiece which will contain the shape and thereafter causing the material to flow into the area vacated by the removed metal as the shape is formed.

The invention may be better understood by reference to the following description and to the accompanying drawings in which:

BRIEF DESCRIPTION OF THE DRAWINGS

FIG. 7 is an end view of the punch and die mechanism taken along the lines 7—7 of FIG. 4.

DETAILED DESCRIPTION OF THE INVENTION

Figure 1:
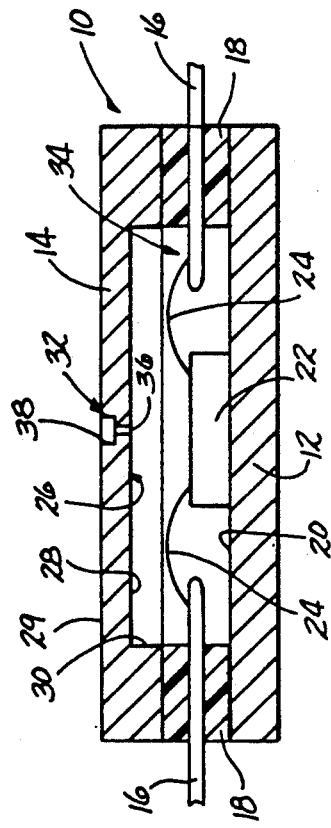
FIG. 1 is a cross-sectional view of an electronic package of the type which may utilize a metal workpiece manufactured in accordance with the present invention.

Referring to the drawings and in particular FIG. 1, an electronic package 10 is shown which includes a metal component that may be made by the shape forming process and apparatus of the present invention. The package 10 is comprised of a base component 12 and a cover or lid component 14. The base and cover components are formed from a ductile material such as a metal or metal alloy. Materials which may be used for these components include low coefficient of thermal expansion materials such as KOVAR and Alloy 42. Materials with higher coefficients of thermal expansion and high thermal conductivity to dissipate heat away from the electronic device such as copper, aluminum, and nickel near alloys are also preferred. One particularly preferred material is aluminum or aluminum alloy as described in U.S. Pat. No. 4,939,316. As mentioned in that patent, preferred aluminum alloys include those designated by the ASM (American Society for Metals) as 3xxx series. These alloys contain up to about 1.5% by weight manganese, along with other alloying ingredients. One especially preferred aluminum alloy is aluminum alloy 3003 having a nominal composition of about 0.12% by weight copper, about 1.5% by weight manganese and the balance aluminum.

A leadframe 16 is disposed between the base component 12 and component 14 and extends from the interior of the package to the outside thereof. The leadframe 16 is made from a conductive material having good tensile strength and typically is comprised of copper, iron or their alloys.

A sealant 18 bonds the leadframe 16 to the base component 12 and the cover component 14 and also bonds the base component 12 and cover component 14 together. The sealant 18 may be a sealing glass or a suitable polymer adhesive as is well known in the art. A resin adhesive such as an epoxy, for example ABLE-TRIK 550K manufactured by Abletrik Laboratories of Gardena, Calif., is one example.

The base component 12 may be generally flat and includes a planar internal surface 20. An electronic device 22, for example a semiconductor device, is bonded to the flat internal surface 20 of the base component 12 by a suitable die-attach means. Wire bonds 24 electrically connect the electronic device 22 to the inner portion of the leadframes 16.

The wire bonds 24 which electrically connect the leadframes 16 to the bonding sites on the surface of electronic device 22 may be formed from thin strips of copper foil by the process known as tape-automated bonding (TAB). These wire bonds 24 flex upwardly as shown in FIG. 1 and accordingly the upper cover or lid component 14 contains a cavity 26 having a bottom surface 28 parallel to the outside surface 29 and perpendicular sidewalls 30.

In some embodiments of metallic packages a vent hole 32 may be provided in the cover component 14 as described more fully in U.S. Pat. No. 4,897,508. The vent hole 32 is a vent for reaction by-products created during the cure cycle of the sealant. After the cure cycle is completed, an inert thermally conductive gas such as helium or thermally conductive, electronically non-conductive liquid may optionally be injected into the package cavity 34 to provide additional thermal dissipation means for the electronic device 22. The vent hole may be in the form of a through bore 36 having a counterbore 38 extending inwardly from the outside surface of the cover as shown in FIG. 1. After the packaging is completed, the vent hole may be sealed by applying a suitable patch as, for example, a drop of solder into the counterbore 38 of vent hole.

While the shape forming method and apparatus of the present invention may be used for many different applications, it will be described herein in connection with the fabrication of the upper component 14 of the metallic package shown in FIG. 1, including formation of the vent hole 32.

As indicated above, the process of the present invention permits the formation of a shape in a metal workpiece in an automated operation. In accordance with the present invention, the metal workpiece is fed into a punch and die mechanism 40 which is mounted in a suitable press (not shown). The metal is fed into the die means in the form of an elongated blank strip 42 which is indexed through the several stations within the punch and die mechanism. The drawings show the formation of the cavity by a "double punching" operation. However, the process of the present invention may also be performed by a "single punching" operation as to be explained below.

Figure 2:
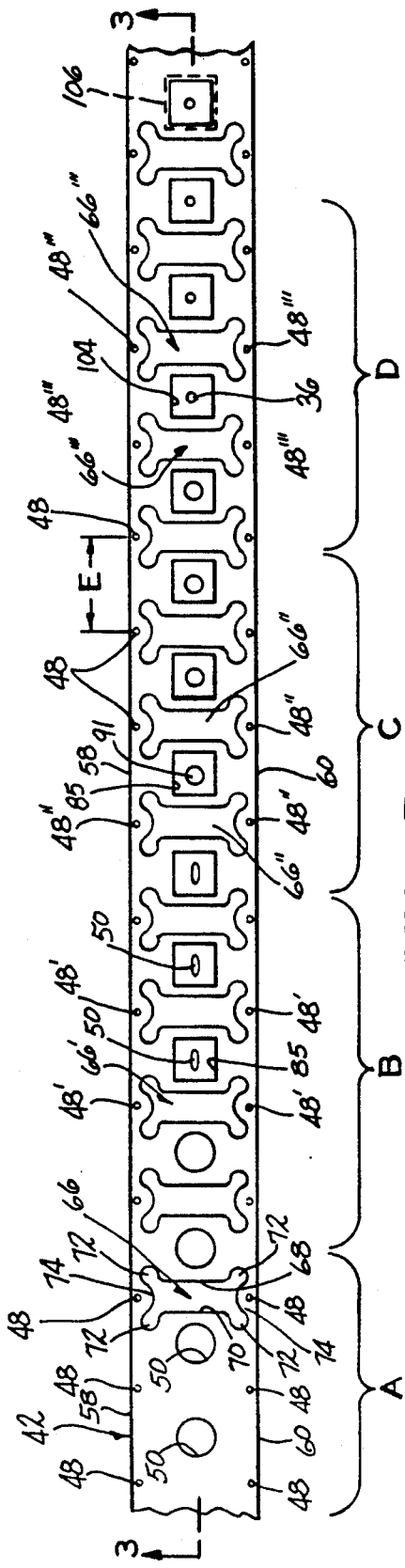
FIG. 2 is a plan view of a strip of metal showing the progression of steps used in forming the shape in the metal.
Figure 3:
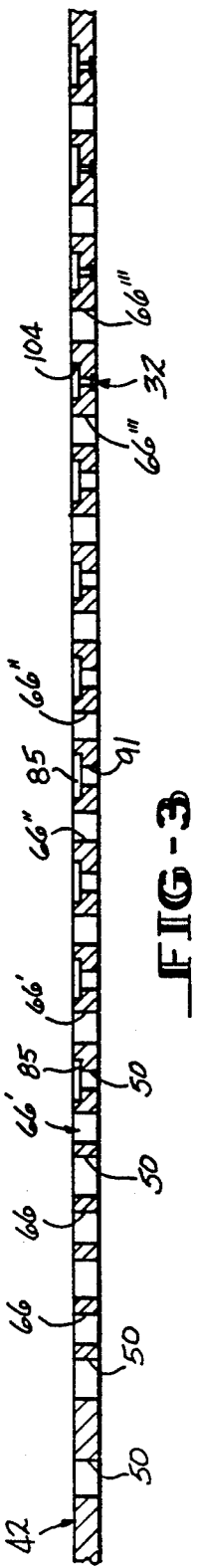
FIG. 3 is a cross-sectional view of the metal strip of FIG. 2 taken along the lines 3—3 of FIG. 2.

Generally, the process involves the use of 4 stations A, B, C and D at which various operations are performed on the metal strip. The strip 42 is advanced into the punch and die mechanism 40 to the first Station A, at which locator punches 46 punch locator holes 48 through the metal strip, one adjacent each of the side edges thereof as shown in FIG. 2. Additionally, at this station, a circular aperture 50 is punched through the strip 42 by means of a suitable punch mechanism 52 being forced through the strip 44 into a circular die 54 in the bottom die block 56 of the punch and die mechanism 40.

The volume of metal removed by the aperture-forming operation should be approximately equal to or slightly less than the volume of metal of the original strip to be displaced to form the cavity in the workpiece. Additionally, in the case of the cover component 14 shown in FIG. 1, which has a vent hole 32 which is formed about a mandrel in the forming operation, the volume of the vent hole is also added to the volume of material to be displaced when determining the size of the aperture. Thus, the diameter of the punch for use in forming the aperture 50 may be calculated by using the formulas:

$$\frac{\pi D^2 T}{4} = V_c + V_v$$

where:
$D$ = diameter of the punch
$T$ = thickness of the material
$V_c$ = volume of the cavity
$V_v$ = volume of the vent hole,
$\pi$ = pi (3.1416), and
$V_c = lwh$, where
  $l$ = length of the cavity
  $w$ = width of the cavity
  $h$ = height of the cavity, and $$V_v = (d_1)^2 \times \tfrac{1}{4} \times h_1 + (d_2)^2 \times \tfrac{1}{4}\pi(h_2)$$

where:
$d_1$ = diameter of counterbore
$d_2$ = diameter of small bore
$h_1$ = height of counterbore
$h_2$ = height of small bore.
$\pi$ = pi (3.146).

Simultaneously with the punching of the circular aperture 50, the side edges 58 and 60 of the metal strip 42 on opposite sides of the aperture 50 are trimmed by shaving punches 62 to insure squareness.

After forming the circular aperture 50 and the locator holes 48, the strip advances to another position in Station A wherein a first set of locator rods 64 extend into the locator holes 48 to position the strip. At this position, a dog bone shaped cutout 66 is punched through the strip immediately ahead of the aperture 50 by a punch 67. The dog bone shaped cutout 66 includes spaced parallel sides 68 and 70 extending perpendicular to the axis of the strip. Each end of the cutout 66 includes generally circular ears 72 extending angularly away from a respective parallel side and connected by a concave portion 74. The locator holes 48 are located outwardly of the concave portions 74 from the center of the strip and in alignment with the axis of dog-bone cutout 66. Thus, the locator holes 48 are separated from the area in which the cavity is to be formed by the ears 66 of the dog-bone cutout 66.

It should be noted that the metal strip 42 is indexed each step a distance equal to the Distance E between two locator holes adjacent to each other in the axial direction of the strip 42. Thus, with the apparatus as shown, a given portion of the strip is indexed to more than one position in a given station.

At the second Station B, when the press is activated and the punch holder 80 is lowered, a dog-bone insert 82 having a shape corresponding to that of the dog-bone cutout 66 is inserted into each of the cutouts (indicated by 66' in FIG. 2) in the strip 42 immediately upstream and downstream of the aperture 50. Additional locator rods extend through the four locator holes (48' as shown in FIG. 2) at the ends of the dog bone. A punch 84, having a cross-section equal to the cross-section of the cavity to be formed, is depressed into the strip to form an initial depression or cavity 85 in the material. This initial depression may be approximately 50 to 70 percent of the desired depth. The side edges 58 and 60 of the strip 50 which was previously trimmed are engaged by slide plates 86 mounted on the die block 56 and which are cammed into clamping engagement with the strip 42 to clamp the strip in a horizontal transverse direction during the initial cavity forming operation. A pressure pad 90 forces the strip 42 against the die block 56 during the formation of the depression 85.

As will be noted from FIG. 2, after the formation of the initial depression 85, the aperture 50, due to the flow of metal, may no longer be a true circle. Accordingly, the aperture should be requalified, that is, the aperture should be reshaped to form a more perfect circle. This is accomplished at the third Station C by a circular punch 92 which is mounted in the punch holder 80 and which is driven through the strip upon actuation of the press. The punch 92 has a diameter sufficient to form the misshaped aperture 50 into a circular aperture 91. Additionally, the side edges 58 and 60 may be retrimmed and the dog-bone cutout 66 reshaped by shaving punches 62 and a dog-bone punch 67 respectively which are mounted at this Station C. Four locator rods 64 extend into the locator holes 48" during this punching operation to position the strip 42.

After the strip 42 is indexed to Station D, the punch holder 80 and a pressure pad 90 move downwardly, and the pressure pad 90 engages the top surface of the metal strip 42 and exerts a force against it independent of the movement and relative force of the punch holder 80 in a manner to be explained below. Locator rods 64 are extended into the locator holes 48'" in the strip 42 to align the strip. Additionally, dog-boned inserts 82 mounted in the pressure pad are inserted into the dog-bone cutouts 66'" which are upstream and downstream of partial depression. Further, spaced sideplates 86, mounted on the die block 56, are cammed into engagement with the side edges 58 and 60 of the strip 42. Thus, the metal surrounding the initial depression 85, is contained from flow in an outward direction away from the aperture 50. The ears on the dog-bone inserts 82 serve to provide a positive block between the area to be worked on and the locator holes 48.

A counterbore-forming pin or mandrel 94 having a small central bore 96 opening inwardly from its inner end face 98 is mounted in the die block 56 and is positioned to extend upwardly above the surface of the die block 56 a distance equal to the depth of the counterbore 38 to form the counterbore 38 in the workpiece. A punch 100, mounted in the punch holder 80 includes a flat bottom face 102 having a pin 103 extending therefrom. The pin 103 is of a diameter substantially equal to the bore 36 of the vent hole 32 to be formed in the workpiece.

After the pressure pad 90 is moved into engagement with the strip 42, the punch holder 80 continues its downward motion to ram the punch 100 into the workpiece to a depth equal to the final desired depression or cavity 104. The pin 103 on the punch 100 enters the bore 96 in the mandrel 94 with the bottom face 102 of the punch 96 in its downward most position being spaced from the end face 98 of the mandrel 94 equal to the height of the smaller bore 36 forming the vent hole 32. Upon movement of the punch into the strip, the metal flows to fill the aperture 91 formed by the previous steps around the counterbore-forming mandrel 94 and the pin 103 on the punch 100 to form the vent hole and finish the cavity.

After this operation, the strip may be indexed to another station (not shown) wherein the final workpiece is blanked out of the strip 42 by punching along the dotted lines 106 shown in FIG. 2. This blanking operation is conventional and any suitable blanking station may be used to perform this operation. Accordingly, this station is not shown in the drawings to avoid undue complexity.

By the process shown and described above, a shape such as a cavity may be formed in a metal workpiece. The cavity may be of a depth which would normally exceed the sheer limit. Also, the process is capable of forming an opening such as a bore or counterbore in a workpiece having a desired configuration. According to the dual-punching operation described above, this is accomplished by first providing an aperture in the workpiece having a volume equal to or slightly less than that of the material to be displaced upon forming the cavity. The workpiece may then be stamped to a depression less than the desired final depression causing the material to flow into the space provided by the aperture formed in the previous operation. The remaining hole may then be requalified so that it is generally circular and the final operation then performed by stamping the workpiece with a punch to the final depression.

As previously mentioned, the process of the present invention may also be accomplished by a single-punching operation. In such an operation, the steps at the intermediate Stations B and C mentioned above of partial depression and requalification of the hole are eliminated. Thus, according to the single-punching process, a circular aperture is first formed in the workpiece followed by pressing the cavity into the workpiece to the final depth in a single operation. Whether the single-punching process is suitable, or whether there must be an intermediate step of partially forming the depression depends upon the original thickness of metal, the depth of the depression and requalification of the aperture to be formed, and the hardness of the metal itself. In either process, if a through bore of some type is not required in the final article, the original hole or aperture need not extend all the way through the workpiece. Rather, a bore in the original workpiece may be provided in the first operation which, while not extending entirely through the workpiece, removes a volume of metal which is the same as or slightly less than the volume of the cavity to be formed. Additionally, the process may be performed at an elevated temperature to improve the metal flow and make it easier for the metal to be displaced.

Figure 4:
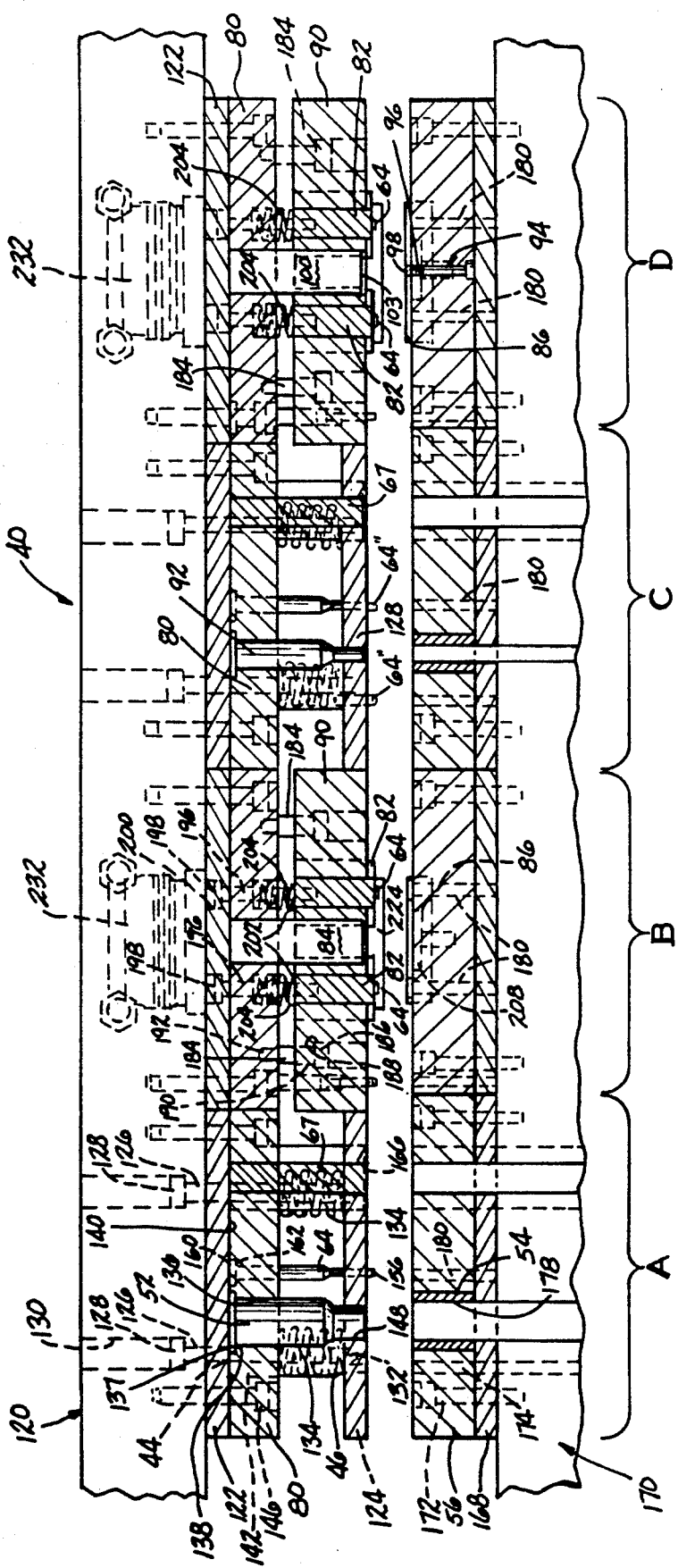
FIG. 4 is a vertical cross-sectional view taken through a punch and die mechanism which may be used to form the shape in the strip of FIG. 2.
Figure 5:
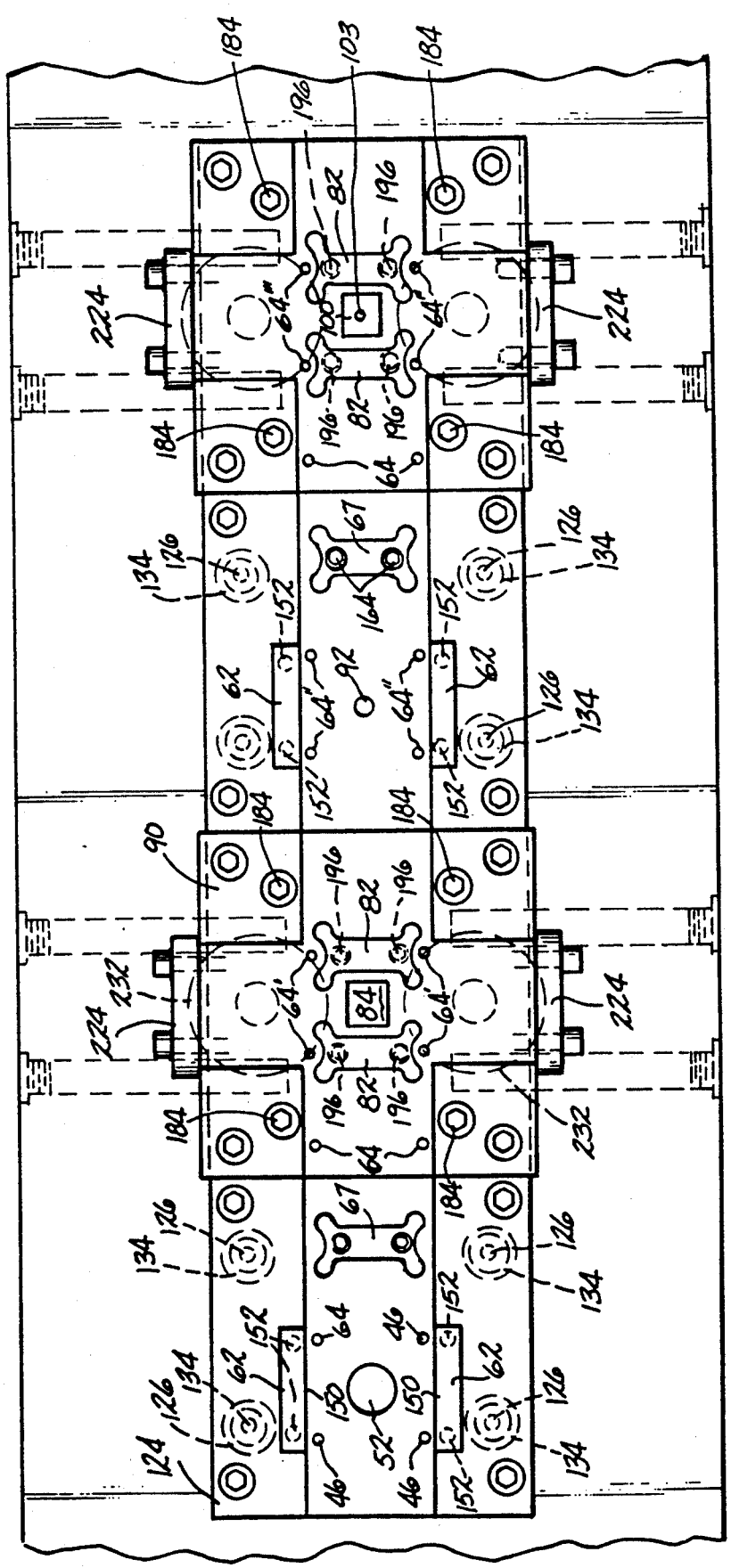
FIG. 5 is a view looking upwardly at the bottom surface of the upper portion of the punch and die mechanism of FIG. 4.
Figure 6:
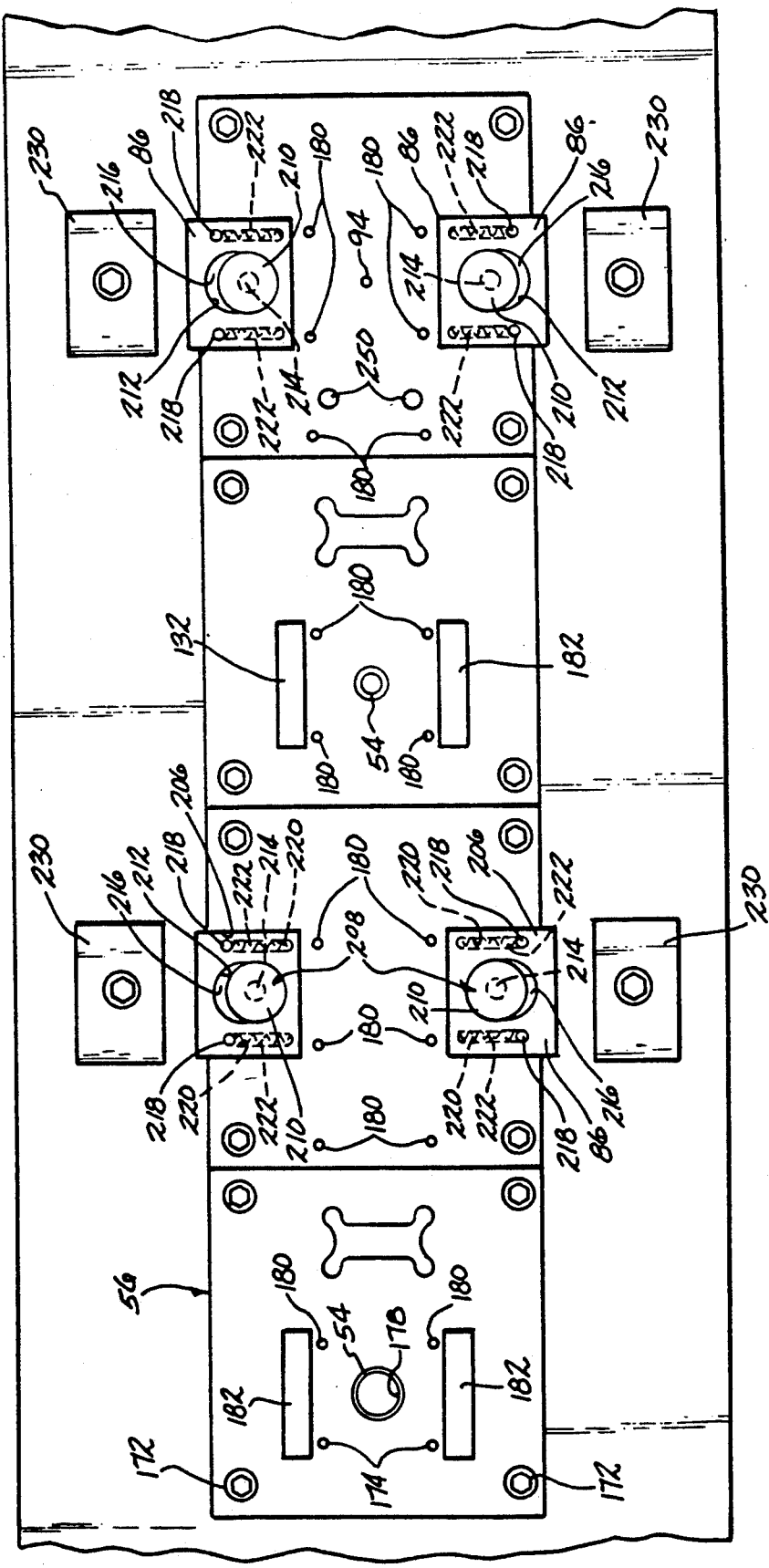
FIG. 6 is a planar view looking down at the upper surface of the bottom portion of the punch and die mechanism of FIG. 4.

Although an apparatus for performing the process of the present invention has generally been referred to above in connection with the description of the process, the following is a more detailed description of a suitable apparatus for performing the invention as shown in detail in FIGS. 4–6.

The punch and die mechanism 40 may include an upper moveable punch member 120 mounted in a suitable press and to which is mounted an upper backplate 122, and the punch holder 80. The backplate and punch holder 80 may each be formed in several sections, one at each station as show, or each as a single member. At Station A of the apparatus, the punch holder 80 provides a mounting for the locator hole punches 46, dog-bone punch 67 and the aperture or hole punch 52. A spring biased stripper plate member 124 is mounted below the punch holder 80 at the first Station A on bolt members 126 having a head portion 128 bottomed in a counterbore 130 in the upper punch member 120. The bolt member 126 has and end portion 132 threaded into the stripper plate 124. The body of the rod member 126 slidingly extends through bores in the backplate 122 and punch holder 80 to permit relative movement of the stripper plate member 124 and the punch holder 80. A spring member 134 surrounds each of the rod members 126 and extends between the bottom of the punch holder 80 and the top surface of the stripper plate 124 to bias the stripper plate 124 in a downward direction spaced from the punch holder.

The aperture punch 52 at Station A is mounted in a bore 136 in the punch holder 80 and has a head portion 137 received within a counterbore 138 in the upper surface of the punch holder 80. The bottom surface 140 of the backplate 122 closes the counterbore 138 so that the punch 52 is contained in an axial direction for movement with the punch holder 80. The locator hole punches 46 are similarly mounted in a bore 142 in the punch holder 80 with a head portion 144 contained between the bottom of a counterbore 146 in the punch holder 80 and the bottom surface 140 of the upper backplate 122. The aperture punch 52 and locator hole punches 46 extend into openings 148 through the stripper plate. The shaving punches 62 are mounted on the punch holder 80 on opposite sides of the axis of the aperture punch 52 and each has a trimming edge 150 positioned to trim a respective side edge 58 or 60 of the strip to ensure proper alignment of the strip for further operation downstream. The shaving punches 62 are held in the punch holder 80 by suitable bolts 152 and extend into openings 154 which extend through the stripper plate 124.

The locator rods 64 provided at intervals throughout the length of the punch and die mechanism 40 adjacent each edge of the strip are mounted in the punch holder 80 and have a forward end portion 156 extending through an opening 158 in the stripper plate 124. The locator rods 64 each have an enlarged head portion 160 seated in a counterbore 162 provided in the upper surface of the punch holder 80. The enlarged head portion 160 is contained between the bottom of the counterbore 162 and the bottom surface 140 of the upper backplate 122 whereby the locator rods 64 are constrained to move with the punch holder 80.

The dog-bone cutout punch 67 is mounted in the punch holder 80 and is held therein by means of bolts 164 as shown in FIG. 5. The stripper plate 124 is provided with an appropriate opening 166 therethrough into which the dog-bone punch 67 extends for relative movement therewith.

The die block 56, having a lower backplate 168 positioned against its bottom surface, is attached to a die member 170 by means of suitable bolts 172. The die block 56 is provided with apertures 174 which form dies for the locator hole punches 46. The bushing 54 is mounted in the die block 56 and has an opening 178 therethrough of a diameter similar to the outer diameter of the aperture punch 52 thereby forming a die for the punch 52. Suitable openings 180 in the die block 56 receive the ends of the locator rods 64 when the punch holder 80 is lowered. The die block 56 is also provided with openings 182 to receive the shaving punches 62 when the punch holder is lowered.

Downstream of the stripper plate 124 at Station B, the pressure pad 90 is mounted beneath the punch holder 80 by suitable bolt members 184 having a head portion 186 at one end bottomed in a counterbore 188 in the pressure pad 90. The bolt members 184 slidingly extend upwardly through a bore 190 in the pressure pad 90 with the other end 192 of the bolt members 184 being threaded into the punch holder 80. This arrangement permits the pressure pad 90 to have relative vertical movement with respect to the punch holder 80. The first punch 84 which forms the initial depression 85 in the strip 42 is mounted in the punch holder 80 and extends down into an opening 194 through the pressure pad 90.

The dog bone inserts 82 are positioned on the upstream and downstream side of the intermediate punch 84 at Station B. The inserts 82 are moveably mounted in the pressure pad 90 and are attached to the punch holder 80 by means of bolts 196. The bolts 196 have their heads 198 mounted in an enlarged bore 200 in the backing plate 122 and bottomed against the upper surface of the punch holder 80. The bolts 196 slidingly extend through the punch holder 80 and are threaded into the top surface 202 of each insert 82 so that the inserts 82 can move vertically with respect both to the punch holder 80 and the pressure pad 90. A suitable spring member 204 extends between the punch holder 80 and the top surface 202 of each of the inserts 82 to bias the inserts 82 downwardly into their lower most position with respect to the punch holder 80 with the head 198 of each bolt 196 bottoming against the upper surface of the punch holder 80.

At Station B, where the initial depression 85 is formed, four locator rods 64 are mounted in the punch holder 80 as previously explained and extend downwardly through the pressure pad 90 as shown in FIG. 4. A pair of locator rods 64 is positioned adjacent the ends of the dog-bone inserts 82 on either side of the initial punch 84 as shown in FIG. 5 so that an ear of a dog-bone insert 82 is positioned between the punch 84 and each of the locator rods 64 at the depression forming location.

The spaced slide plates 86 are mounted on opposite edges of the die block 56 in a suitable groove 206 and are contained therein by headed retaining bolts 208. The spaced slide plates 86 at Station B are similar to the slide plates 86 at Station D and accordingly, reference may be made to FIG. 7 for a more detailed showing of this construction. Each of slide plates 86 has limited movement in a direction transverse to the axis of movement of the strip 42 by virtue of the head 210 of each retaining bolt 208 being mounted in an enlarged counterbore 212 in the slide plate 84 with the shaft 214 of each bolt 208 extending through an elongated slot 216 in the slide plate 84. Pin members 218 extend downwardly from each of the slide plates 84 into a respective groove 220 in the die block 56. A spring 222 extends between each pin member 218 and the inner end of its groove 220 to bias the slide plate 84 outwardly.

A cam actuator member 224 is attached to each side of the punch holder 80. Each cam actuator member 224 includes a downwardly extending portion 226 projecting below the bottom surface of the pressure pad 90 in a position to engage a respective slide plate 84 and urge the slide plate 84 toward the center axis of the die block 56 against the side edge of the metal strip 42 positioned thereon upon downward movement thereof. For this purpose, the inside surface 228 of each of the downwardly extending portions 226 is slightly tapered as indicated to provide a camming action. Outer support blocks 230 are positioned on the die member 170 and spaced from the die holder 56 to provide a backing for the cam actuator member 224 to ensure the proper holding force of the slide plates 84 against the metal strip when the punch holder 84 is lowered and the depression 85 formed in the metal strip 42.

The pressure pad 90 is urged downwardly with respect to the punch holder 80 by gas cylinders 232 mounted on each side of the horizontal longitudinal axis of the intermediate punch member 84. The arrangement of the cylinders 232 at Station B is the same as the cylinders at Station D so reference may be made to FIG. 7 for a more detailed showing. Each cylinder 232 has a piston (not shown) which acts on one end of a free floating piston extension 234 freely mounted in the upper backplate 122 and punch holder 80. The other end of the piston extension 234 engages the upper surface of the pressure pad 90. A suitable gas under pressure such as nitrogen is introduced into the cylinders 232 through a pressure regulator (not shown) so that the pistons of each cylinder, acting through the piston extensions 234 impose a force on the pressure pad 90 in a direction downwardly relative to the punch holder 80. The free floating piston extensions 234 permit relative movement between the pressure pad 90 and punch holder 80 while maintaining a connection between the cylinders 232 and the pressure pad 90. Thus, as the punch holder 80 is lowered and the pressure pad 90 engages the metal strip, the pressure pad 90 will continuously exert a constant force on the strip 42 dictated by the pressurized gas in the cylinders 232 as the punch holder 80 continues its downward movement relative to the pressure pad 90.

As mentioned above, in the "dual punch" process, the aperture 50 in the strip 42 is requalified after the initial partial depression 85 is formed. Accordingly, the apparatus includes a third Station C downstream of the initial depression forming station B at which the second circular aperture punch 92 is mounted. This station includes a punch holder 80 which may be a continuation of the punch holder at the previous stations or a separate member. The circular aperture punch 92 is mounted as explained in connection with the first aperture punch 52 at Station A. Four locator rods 64, mounted in the punch holder 80, are provided as shown in FIGS. 4 and 5 to properly locate the strip. If desired, a dog-bone punch 67 mounted as described in connection with Station A may be provided downstream of the punch 92 to reshape the dog-bone cutouts 66 in the strip. A stripper plate 124 is also provided as in the case of Station A. If it is necessary to retrim the side edges 58 and 60 of the metal strip 42, shaving punches 62 may be provided. Thus, this Station C is similar to the first Station A except that locator rods are substituted for the locator hole punches of Station A and the circular hole punch will be of a lesser diameter as its purpose is merely to requalify the aperture 50 in the strip into essentially a true circle.

Station D, at which the final depression 104 is formed as well as the vent hole 32, is located downstream of the requalifying Station C, and is similar in many respects to the Station B at which the intermediate depression 85 is formed. This Station D includes a punch holder 80 and an upper backplate 122, which may be either separate members or a continuation of the back plate 122 and punch holder 80 at the previous station. A pressure pad 90 is provided at this Station D and is mounted for relative movement with respect to the punch holder 80 as explained in connection with the pressure pad 90 at the intermediate punching Station B. Station D also includes locator rods 64 mounted on the punch holder 80, openings 166 in the die block 56 to receive the ends of the locator rods 64 upon closing of the press, dog-bone inserts 82, and a punch 100, all mounted as explained in connection with Station B. Station D also includes slide plates 86, cam actuator members 224 and support blocks 230, all as mentioned in connection with Station B. Similarly, gas cylinders 232 acting through floating piston extensions 234 are provided to impose a force on the pressure pad 90 to maintain a force on the strip 42 relative to the punch holder 80 as the press is lowered as previously described in connection with Station B.

Station D also includes means for forming the vent hole 32 in the metal strip. This includes the mandrel 94 mounted in the die block 56 and extending slightly above the surface thereof. The mandrel 94 has a diameter equal to the diameter of the desired counterbore 38 of the vent hole 32 and extends upwardly from the bottom surface of the die block 56 a distance equal to the depth of the counterbore 38 to be formed in the metal strip 42. The punch 100 at this station D is provided with a projecting pin member 103 extending downwardly from the bottom face 102 of the punch 100. The pin 103 is adapted to extend into the bore 96 extending downwardly from the upper end face 98 of the counterbore-forming mandrel 94 to provide a mandrel for the formation of round bore 36 in the workpiece.

As the counterbore-forming mandrel 94 extends upwardly above the surface of the die block 56, spring bias lifters 250 may be provided in the die block 56 upstream of the mandrel 94 as shown in FIG. 6 so that the metal strip 42 is lifted upwardly slightly as it is indexed to avoid catching on the upwardly extending mandrel 94.

With the "dual punch" version of the apparatus as shown, at the first Station A, upon the downward stroke of the press, the punch holder 80 and stripper plate 124 are moved downwardly until the stripper plate 124 engages the strip 42 positioned on the top surface of the die block 56. Continued downward movement of the punch holder 80 results in the locator hole punches 46 and the aperture punch 52 punching out suitable holes in the metal strip as they continue their downward movement with respect to the stripper plate 124. Similarly, the dog-bone shaped cutout 66 is punched into the metal strip 42 by the dog-bone punch 67. At the same time, the side edges 58 and 60 of the metal strip are trimmed by the shaving punches 62. Upon upward return movement of the punch holder 80, the stripper plate 124 maintains engagement with the metal strip 42 until the various punches 46, 52 and 67 have been withdrawn out of the strip 42 and up into the stripper plate 124 to prevent lifting of the strip 42.

Simultaneously, at the second Station B, upon the downward stroke of the press, the locator rods 64 extend through the locator holes 48' in the strip 42 and the dog-bone inserts 82 extend into the respectively shaped cutouts 66' in the metal strip to properly position the metal strip with respect to the punch 84. Continued downward movement of the punch member results in the pressure pad 90 engaging the strip 42 and, by virtue of the pressurized gas cylinder 232 acting on the pressure pad 90 through the free floating piston 234, the pressure pad 90 holds the strip against the die block 56 under a constant pressure determined by the pressure of the gas in the cylinder 232. The punch holder 80 continues downward movement relative to the pressure pad 90 and results in the punch 84 forming the initial depression 85 in the strip 42 to the predetermined depth set by the position of the punch 84.

As the punch holder 80 is lowered at Station B, the cam actuators 224 on the punch holder 80 cam the slide plates 86 inwardly so that their inner side edges abut against the trimmed side edges 58 and 60 of the metal strip. Thus, the metal of the strip is basically contained from flow in all directions except in the direction of the aperture which was formed therein during the aperture forming operation of Station A. This containment is provided by the dog-bone inserts 64 and the slide plates 88 in a horizontal direction, and by the pressure pad 80 and the die block 56 in a vertical direction. Thus, the metal is constrained to flow into the area formed by the aperture 50 in the metal strip 42.

The operation at the requalifying Station C is similar to that of the hole punching Station A. As the press is lowered, the locator rods 64 enter the locator holes 48" in the metal strip and align the metal strip 42 with respect to the axis of the hole forming punch 92. Continued downward movement of the punch holder 80 results in the circular punch 92 stamping out an aperture 91 of suitable diameter. The stripper plate 124 at this Station A performs a similar function as in the first station in that it provides a relative downward force on the metal strip as the circular punch 92 is being raised so that the strip 42 does not raise up from the surface of the die blocks with the punch 92.

At Station D where the cavity is formed to its final depth and the vent hole formed, the operation of the apparatus is similar to that of the intermediate cavity-forming Station B. As the die holder 80 moves downwardly, the locator rods 64 enter the locator holes 48'" in the metal strip 42, the dog-bone inserts 82 enter the cutouts 66'" in the metal strip and the slide plates 86 are forced against the outer edges 58 and 60 of the metal strip by virtue of the tapered surfaces 202 on the cam actuators 204. The pressure pad 90 is maintained against the upper surface of the metal strip by virtue of the gas cylinders 232 acting through the floating pistons 234 so that the metal strip is confined in substantially all directions except in the direction toward the hole which is cutout in the strip. Thus, as the punch 106 contacts the bottom of the previously formed cavity in the metal strip, the metal flows around the mandrel 94 extending upwardly from the surface of the die block 56 into the aperture 91 in the metal strip 42 and the pin 103 on the bottom surface 102 of the punch 100 thereby forming the vent hole 32 in the workpiece as well as the final cavity 104 of the desired depth.

As an example of "double punching" operation, a strip of aluminum alloy having a thickness of 0.051 was processed in accordance with the present invention to form therein a square cavity of a depth of 0.30 inch and 0.510 inch on a side. A vent hole comprising a 1/32 inch round hole and a ⅛ inch counterbore hole extending inwardly from the bottom surface of the strip. The volume of material to be displaced was calculated to be 0.01041 cubic inches. A ⅛ inch diameter punch was used to form an aperture through the strip. Thereafter, a punch was used to form an initial cavity 0.590 inch on a side and 0.020 inch deep. The aperture was requalified by the use of a 3/16 inch punch. Thereafter, the final cavity and vent hole were formed by a square punch 0.590 inch on a side which was used to depress the initial cavity to the final depth of 0.030 inch. A mandrel extending inwardly from the die block and a pin extending from the bottom surface of the punch provided a core about which the metal flowed to form the vent hole.

By way of an example of a "single punching" operation a workpiece consisting of a metal strip of aluminum alloy 3003 having a thickness of 0.056 inch was worked upon by the present process to produce a square cavity having a depth of 0.030 inch and 0.590 inches on a side. A vent hole was formed comprising a 1/32" round hole as well as a ⅛" counterbore hole extending inwardly 0.012 inch. By calculating the volume of cavity to be formed plus the volume of the vent hole, it was determined that the total volume of material to be displaced was 0.01045 cubic inches. Based upon this calculation, the diameter of the aperture formed at the first station was 23/64 inch. At another station, a 0.590" punch was used to penetrate the material to the desired depth of 0.030 inch. A pin extending from the bottom surface of the punch and a mandrel extending upwardly from the bottom surface of the die blocks provided a core about which the metal flowed to form the vent hole.

In both of the above examples, the final workpiece was well formed and free of any shearing or tearing around the bottom edges of the cavity. By virtue of the above-described method and apparatus, a workpiece can be formed with a cavity to a depth exceeding its shearing limit as well as using the same apparatus to form either a bore extending into the cavity or such other configurations as may be desired.

While the invention has been described above with reference to specified embodiments thereof, it is apparent that many changes, modifications and variations can be made without departing from the inventive concept disclosed herein. Accordingly, it is intended to embrace all such changes, modifications and variations that fall within the spirit and broad scope of the appended claims. All patent applications, patents and other publications cited herein are incorporated by reference in their entirety.

What is claimed is:

1. A process for forming a shape in an area of a metal workpiece comprising:
    removing a portion of the metal of the workpiece in the area which will contain the shape, and causing a portion of the remaining metal to flow into the area vacated by the removed metal as the shape is formed while constraining the remaining metal from flowing in directions away from the vacated area.

2. The process of claim 1 further comprising constraining the metal from flowing in substantially all directions except into the area from which said metal has been removed during formation of the shape.

3. A process for forming a shape in an area of a metal workpiece comprising:
   forming an aperture through the workpiece in the area in which the shape is to be formed, and
   causing the workpiece metal to flow into the aperture as the workpiece is being shaped while constraining the workpiece metal from flowing in directions away from the aperture.

4. The process of claim 3 wherein said aperture is circular in cross-section.

5. The process of claim 4 further comprising partially shaping said workpiece and requalifying said aperture into a circular cross-section prior to a final shaping.

6. A process for forming a cavity in an area of a metal workpiece comprising:
   removing a portion of the metal from the workpiece in the area in which the cavity is to be formed, and thereafter,
   depressing the remaining metal in said area to cause said metal to flow into the area vacated by the removed metal to form the cavity while constraining said remaining metal from flowing in directions away from the vacated area.

7. The process of claim 6 wherein said workpiece has a predetermined thickness and said cavity has a depth in said workpiece of at least 50% of the thickness of the workpiece.

8. The process of claim 6 wherein said workpiece has a predetermined thickness and said cavity has a depth in said workpiece of at least 35% of the thickness of the workpiece.

9. The process of claim 8 wherein said cavity is defined by a planar base and parallel side walls.

10. The process of claim 6 wherein said portion of metal removed from said workpiece forms an aperture extending through said workpiece.

11. The process of claim 10 wherein said aperture is circular in cross-section.

12. The process of claim 10 wherein said workpiece has a predetermined thickness and a final cavity is formed by depressing an initial cavity into said workpiece to a depth at least 50% of the depth of the final cavity, requalifying said aperture into a circular cross-section after depressing said initial cavity, and thereafter, depressing the remaining metal in said initial cavity to the final depth thereby forming said final cavity.

13. The process of claim 10 wherein the bottom of said cavity to be formed includes a base and further including forming the base of said cavity about a mandrel as said cavity is formed to form a shaped bore extending from the bottom of the cavity to the outside bottom surface of the workpiece.

14. The process of claim 10 wherein said cavity is formed by a punch member being depressed into said workpiece.

15. The process of claim 14 further comprising holding said workpiece under a force independent of the force of the punch member.

16. The process of claim 15 wherein said workpiece is in the form of a metal strip and the shape is formed by indexing said strip through a plurality of stations, said process further comprising forming locating holes in said metal strip, forming a dog-bone shaped cutout having opposed ends and extending transversely across said strip immediately upstream and downstream of said area in which the cavity is to be formed, said locator holes being positioned adjacent the ends of said dog-bone shaped cutouts, and positioning locator rods in said locator holes and inserts in said cutouts during forming of the cavity.

17. The process of claim 15 wherein said independent force on said workpiece is applied by a pressure pad having relative movement with respect to said punch.

18. The process of claim 17 wherein a gas cylinder applies the force to said pressure pad independent of the force of the punch.

* * * * *